United States Patent

Kawai

[11] Patent Number: 5,912,727
[45] Date of Patent: Jun. 15, 1999

[54] PROJECTION EXPOSURE METHOD IN WHICH MASK PATTERNS ARE IMAGED ON PHOTOSENSITIVE SUBSTRATES WITH ADJUSTMENT OF ILLUMINATION AND PROJECTION PARAMETERS CORRESPONDING TO THE MASK PATTERN

[75] Inventor: Hidemi Kawai, Chiba, Japan

[73] Assignee: Nikon Corporation, Tokyo, Japan

[21] Appl. No.: 08/614,899

[22] Filed: Mar. 13, 1996

Related U.S. Application Data

[63] Continuation of application No. 08/354,773, Dec. 12, 1994, abandoned, which is a continuation of application No. 08/196,776, Feb. 14, 1994, abandoned, which is a continuation of application No. 07/989,549, Dec. 11, 1992, abandoned.

[30] Foreign Application Priority Data

Dec. 18, 1991 [JP] Japan ................................. 3-353754

[51] Int. Cl.[6] .......................... G03B 27/42; G03B 27/54; G03B 27/72
[52] U.S. Cl. .................. 355/67; 355/53; 355/71
[58] Field of Search .................... 355/53, 67, 71

[56] References Cited

U.S. PATENT DOCUMENTS

| | | | |
|---|---|---|---|
| 4,272,186 | 6/1981 | Plummer | 355/71 |
| 4,758,863 | 7/1988 | Nikkel | 355/40 |
| 4,780,747 | 10/1988 | Suzuki et al. | 355/53 |
| 4,792,693 | 12/1988 | Yamaguchi et al. | 356/401 |
| 4,908,656 | 3/1990 | Suwa et al. | 355/71 |
| 4,931,830 | 6/1990 | Suwa et al. | 355/71 |
| 4,970,546 | 11/1990 | Suzuki et al. | 355/53 |
| 5,097,291 | 3/1992 | Suzuki | 355/53 |
| 5,117,255 | 5/1992 | Shiraishi et al. | 355/53 |
| 5,184,196 | 2/1993 | Nakagawa et al. | 355/53 |
| 5,191,374 | 3/1993 | Hazama et al. | 355/53 |
| 5,194,893 | 3/1993 | Nishi | 355/53 |
| 5,272,501 | 12/1993 | Nishi et al. | 355/53 |
| 5,286,963 | 2/1994 | Torigoe | 355/71 |
| 5,305,054 | 4/1994 | Suzuki et al. | 355/53 |

*Primary Examiner*—R. L. Moses
*Assistant Examiner*—Shival Virmani
*Attorney, Agent, or Firm*—Shapiro & Shapiro

[57] ABSTRACT

An exposure method of illuminating a pattern on a mask by a light beam from an illuminating optical system and exposing the image of the pattern onto a photosensitive substrate through a projection optical system comprises the steps of discriminating the kind of the mask, setting the state of at least one of the field stop of the illuminating optical system, the aperture stop of the illuminating system and the aperture stop of the projection optical system in conformity with the discriminated kind of the mask, and projecting the image of the pattern on the mask onto a predetermined area of the photosensitive substrate.

6 Claims, 6 Drawing Sheets

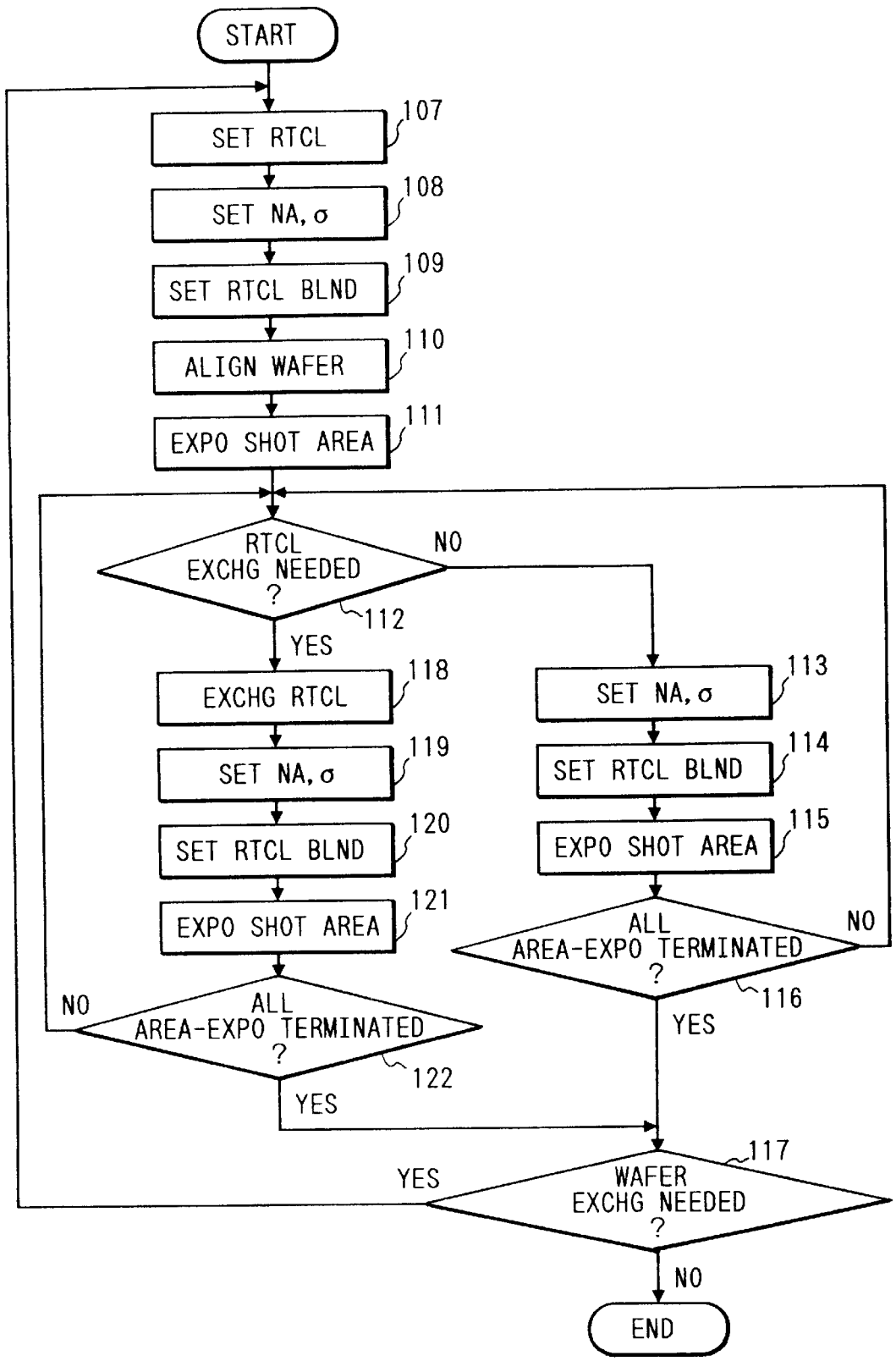

PROJECTION EXPOSURE METHOD IN WHICH MASK PATTERNS ARE IMAGED ON PHOTOSENSITIVE SUBSTRATES WITH ADJUSTMENT OF ILLUMINATION AND PROJECTION PARAMETERS CORRESPONDING TO THE MASK PATTERN

This is a continuation of application Ser. No. 08/354,773 filed Dec. 12, 1994, which is a continuation of application Ser. No. 08/196,776 filed Feb. 14, 1994, which is a continuation of application Ser. No. 07/989,549 filed Dec. 11, 1992, all now abandoned.

BACKGROUND OF THE INVENTION

1. Field of the Invention

This invention relates to a projection exposure method and a projection exposure apparatus suitable for use, for example, in a lithography process for the manufacture of semiconductors.

2. Related Background Art

For example, in the process of manufacturing a semiconductive element or a liquid crystal substrate by the use of lithography technique, use is made of a projection exposure apparatus for transferring a reticle pattern such as a circuit pattern onto a substrate at a predetermined magnification through a projection optical system. In such a projection exposure apparatus, the line width of the pattern to be transferred is as minute as e.g. 0.5 µm. To image a pattern of such minute line width well, it is necessary to make the numerical aperture (NA) of the projection optical system great. Also, as a reticle, use has recently been made of a so-called phase shift reticle or the like which positively makes the most of the interference effect of light, but for such a phase shift reticle, it is necessary to enhance the coherency of exposure light.

In FIG. 6 of the accompanying drawings which is a schematic view of the illuminating system of a projection exposure apparatus according to the prior art, exposure light emitted from a fly-eye lens 1 as a secondary light source and passed through the opening portion of a variable aperture stop 2 disposed near the exit surface thereof (the focal plane adjacent to the reticle side) is converted into a substantially parallel light beam by an output lens 3. Of this substantially parallel light beam, a light beam passed through the opening portion of a reticle blind 4 as a variable field stop is converted into substantially parallel exposure light IL of large aperture by a relay lens 5 and a main condenser lens 6 and illuminates a reticle 7 with substantially uniform illuminance. The pattern forming surface of the reticle 7 and the opening portion of the reticle blind 4 are in an optically conjugate positional relation, and by changing the shape of the opening portion of the reticle blind 4, the shape and size of the illuminated area on the reticle 7 can be set arbitrarily.

The pattern on the pattern forming surface of the reticle 7 is transferred onto the exposure surface of a wafer 9 at a predetermined magnification by a projection lens 8. A variable aperture stop 10 is disposed on the pupil plane P1 of the projection lens 8, and the variable aperture stop 2 and the variable aperture stop 10 are in an optically conjugate positional relation.

As numerical values representative of the characteristic of the illuminating system of the projection exposure apparatus, use is generally made of the numerical aperture NA of the projection lens and σ value representative of the coherency of exposure light. Describing the numerical aperture and σ value with reference to FIG. 6, the maximum angle $\theta_R$ at which the light beam from the reticle 7 side of the projection lens 8 can pass and the maximum angle $\theta_W$ of the light beam falling from the projection lens 8 to the wafer 9 side are limited to predetermined values by the variable aperture stop 10 on the pupil plane P1 of the projection lens 8. The numerical aperture $NA_{PL}$ of the projection lens 8 is sin $\theta_W$, and is in the relation that sin $\theta_R$=sin $\theta_W$/m when the projection magnification is 1/m.

Also, when the maximum angle of incidence at which the exposure light IL is incident on the reticle 7 is $\theta_{IL}$, $\sigma_{IL}$ which is the σ value of the illuminating system producing the exposure light IL is defined as follows:

$\sigma_{IL}$=sin $\theta_{IL}$/sin $\theta_R$=m·sin $\theta_{IL}$/sin $\theta_W$.

Generally, the greater is the numerical aperture NA, the more is improved resolution, but the depth of focus becomes shallow. On the other hand, the smaller is the σ value, the better becomes the coherency of the exposure light IL and therefore, when the σ value becomes small, the edge of the pattern is emphasized, and when the σ value is great, the edge of the pattern becomes blurred. Accordingly, the imaging characteristic of the pattern is substantially determined by the numerical aperture NA and the σ value. Also, when the σ value is varied by the variable aperture stop 2, the illuminance distribution on the pupil plane P1 of the projection lens 8 is varied.

The sequence when in the prior-art projection exposure apparatus of FIG. 6, a reticle pattern is exposed on a wafer will hereinafter be described with reference to FIG. 7 of the accompanying drawings.

In this case, first at a step 101, the operator manually operates the variable aperture stop 10 of the projection lens 8 to thereby set the numerical aperture NA of the projection lens 8 to a value that can resolve the minimum line width on the reticle to be transferred. The operator then operates the variable aperture stop 2 to thereby set the σ value of the illuminating system in accordance with the reticle 7 to be transferred, and thereafter sets the reticle to be transferred on a reticle holder (step 102).

Thereafter, the mask pattern of the reticle is transferred to a plurality of wafers in succession through the projection lens 8 (step 103). When the optimum numerical aperture NA of the next reticle to be transferred and the σ value of the illuminating system differ, at a step 104, the operator manually adjusts the variable aperture stop 10 and the variable aperture stop 2. Thereafter, the operator exchanges the reticle (step 105), whereafter the exposure process for a plurality of wafers is again carried out (step 106).

As described above, in the prior-art projection exposure apparatus, the two parameters, i.e., the numerical aperture NA and the a value, are apparatus constants and therefore, once the operator manually effects setting, it has been impossible to change those two parameters in a series of exposure sequences. However, the optimum numerical aperture NA and σ value differ depending on the required imaging performance such as the minimum line width of the projection-exposed pattern on the reticle or the dimensional fidelity of the transferred pattern on the wafer to the mask pattern on the reticle.

Accordingly, where an IC for so-called specific use (ASIC) is to be manufactured and the patterns of plural kinds of device chips differing in the value of the optimum imaging parameter are to be exposed on the same wafer, it has heretofore been impossible to change the value of the parameter in the course of the process and therefore, it has been unavoidable to set the value of the parameter to the optimum value for only a particular one of those plural kinds of patterns. This means that the other patterns have not always been exposed under optimum imaging conditions.

Likewise, where a plurality of patterns differing in the value of the optimum parameter exist in the reticle, it has heretofore been unavoidable to set the value of the parameter to the optimum value for only a particular one of those patterns.

SUMMARY OF THE INVENTION

In view of such points, the present invention has as an object the provision of a projection exposure method and a projection exposure apparatus which can obtain an optimum imaging characteristic as a whole even when a plurality of device chips differing in the optimum values of imaging parameters such as numerical aperture NA and σ value are exposed on the same wafer or when a plurality of patterns on a reticle in which a plurality of patterns differing in optimum parameters exist are successively exposed onto the same wafer. The projection exposure method according to the present invention, as shown, for example, in FIG. 3 of the accompanying drawings, is an exposure method of illuminating a pattern on a mask by a light beam from an illuminating optical system and exposing the image of the pattern onto a photosensitive substrate through a projection optical system, having the step of discriminating the kind of the mask (step 107), the step of setting the state of at least one of the aperture stop of the illuminating system and the aperture stop of the projection optical system (steps 108 and 109), and the step of projecting the image of the pattern on the mask onto a predetermined area of the photosensitive substrate (steps 110 and 111).

Also, the projection exposure apparatus according to the present invention, as shown, for example, FIG. 1 of the accompanying drawings, is an exposure apparatus for exposing the image of a pattern (PA) on a mask (7) onto a photosensitive substrate, having an illuminating optical system having a first variable aperture stop (30) and for illuminating the pattern (PA) on the mask by a light beam sensitizing the photosensitive substrate (9), a projection optical system (8) having a variable aperture stop (10) and for projecting the image of the pattern (PA) on the mask onto the photosensitive substrate (9), first stop setting means (31) for setting the state of the first variable aperture stop (30), second stop setting means (33) for setting the state of the variable aperture stop (10) of the projection optical system (8), a second variable aperture stop (21) disposed at a location in the illuminating optical system which is conjugate with the first variable aperture stop (30), third stop setting means (22) for setting the state of the second variable aperture stop (21) to change the illuminating condition of the illuminating optical system for the mask (7), mask discriminating means (12) for discriminating the kind of the mask, and exposure control means (34) for driving the first to third stop setting means (31, 33, 22) in conformity with the kind of the mask discriminated by the mask discriminating means and adjusting the imaging characteristic on the photosensitive substrate.

According to the projection exposure method of the present invention, when the patterns of a plurality of masks differing in optimum imaging parameters (numerical aperture NA and σ value) are to be exposed, for example, onto different areas on a photosensitive substrate, respectively, the kind of a first mask is first discriminated and the values of the optimum imaging parameters are examined, whereafter the first mask is set. The aperture stop of the illuminating system and the aperture stop of the projection optical system are then adjusted, and the numerical aperture NA of the projection optical system and the σ value of the illuminating system are set to the values of the optimum parameters. Also, the field stop of the illuminating system is adjusted in conformity with the pattern area of the first mask, whereafter the pattern of the first mask is exposed onto a first area of the photosensitive substrate, for example, by the step and repeat system.

Subsequently, the kind of a second mask is discriminated and the values of optimum imaging parameters are examined, whereafter the second mask is set. The numerical aperture NA of the projection optical system and the a value of the illuminating system are then set to the values of the optimum imaging parameters and the field stop of the illuminating system is adjusted in conformity with the pattern area of the second mask, whereafter the pattern of the second mask is exposed onto a second area of the photosensitive substrate, for example, by the step and repeat system. By repeating such steps, the patterns of a plurality of masks differing in the values of optimum parameters can be exposed onto the different areas, respectively, of the same photosensitive substrate under optimum imaging conditions.

Also, where a plurality of pattern areas differing in optimum parameters exist on a mask, the kind of the mask is first discriminated and the shapes of those pattern areas and corresponding optimum imaging parameters are examined. The mask is then set, whereafter the field stop of the illuminating system, the numerical aperture NA of the projection optical system and the σ value of the illuminating system are set correspondingly to a first pattern. Thereafter, the first pattern is exposed in succession from a first shot area of the photosenstivie substrate if the step and repeat system is used.

Subsequently, the field stop of the illuminating system, the numerical aperture NA of the projection optical system and the σ value of the illuminating system are set correspondingly to a second pattern of the mask. Thereafter, the second pattern is exposed again in succession from the first shot area of the same photosensitive substrate if the step and repeat system is used. By repeating such steps, a plurality of patterns differing in the values of optimum imaging parameters can be exposed in the same shot area of the same photosensitive substrate under optimum imaging conditions.

Also, if the projection exposure apparatus of the present invention is used, the above-described projection exposure method can be directly carried out.

That is, according to the projection exposure method and projection exposure apparatus of the present invention, exposure can be accomplished while the states of the field stop of the illuminating system, the aperture stop of the illuminating system and the aperture stop of the projection optical system are set in conformity with the kind of a mask. Accordingly, there is the advantage that exposure can always be accomplished under optimum imaging conditions even when the patterns of a plurality of masks differing in the values of optimum imaging parameters are successively exposed onto the same photosensitive substrate or when the patterns of a mask on the same surface of which are formed plural kinds of patterns differing in the values of optimum imaging parameters are successively exposed onto a photosensitive substrate.

BRIEF DESCRIPTION OF THE DRAWINGS

FIG. 3 is a flow chart showing an example of the exposing operation of the embodiment.

DESCRIPTION OF THE PREFERRED EMBODIMENTS

Figure 1:
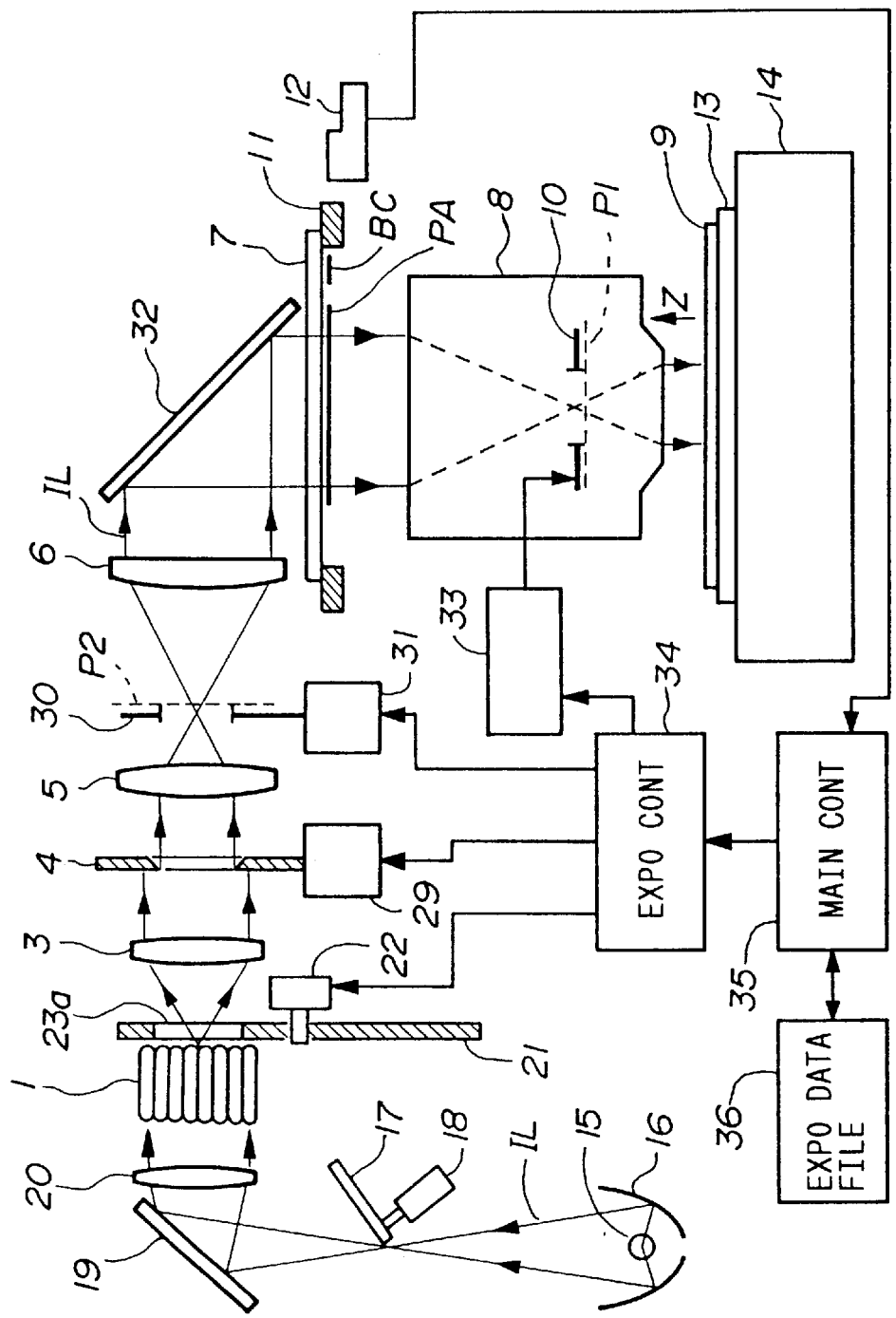
FIG. 1 is a construction diagram, partly in cross-section, showing the essential portions of a projection exposure apparatus according to an embodiment of the present invention.

An embodiment of the present invention will hereinafter be described with reference to FIGS. 1 to 5. This embodiment is one in which the present invention is applied to a reduction projection exposure apparatus of the step and repeat type for the manufacture of semiconductive elements like the example of the prior art shown in FIG. 6, and in FIG. 1, portions corresponding to those in FIG. 6 are given the same reference characters and need not be described in detail.

FIG. 1 shows the general construction of the projection exposure apparatus according to the present embodiment, and in FIG. 1, a reticle 7 is held on a reticle holder 11 and a bar code reader 12 is disposed near the reticle holder 11. A bar code BC representative of the kind of the reticle 7 is formed outside the pattern area PA of the reticle 7, and when the reticle 7 is set on the reticle holder 11, the bar code BC is read by the bar code reader 12, whereby the appellation of the reticle 7 can be discriminated. More particularly, the appellations of a plurality of reticles to be handled by this projection exposure apparatus and the operation parameters of steppers corresponding to the respective appellations are pre-registered in a main controller 35 which will be described later. When the bar code reader 12 reads the bar code BC, the main controller 35 drives a rotatable plate 21 to be described, a reticle blind 4 and variable aperture stops 10, 30, as one of the operation parameters corresponding to those appellations, on the basis of information regarding the illuminating conditions for the pre-registered reticles. The above-described operation can also be executed by the operator directly inputting a command and data from a keyboard to the main controller 35. The above-mentioned information corresponds to the kinds of the reticles, the degree of minuteness, periodicity, etc. of the patterns thereof.

The reference numeral 13 designates a wafer and the reference numeral 14 denotes a wafer stage which comprises an XY stage which can be positioned in a two-dimensional plane perpendicular to the optical axis of a projection lens 8, a Z stage which can be positioned in the direction of the optical axis of the projection lens, a levelling stage, etc. A driving mechanism and a coordinates measuring mechanism are incorporated in the XY stage and Z stage, respectively, of the wafer stage 14. The wafer holder 13 and the wafer 9 are placed on the wafer stage 14 in the named order.

A description will now be given of the construction of an illuminating system for exposure light IL for illuminating the reticle 7 in the present embodiment. In FIG. 1, the reference numeral 15 designates an illuminating light source for exposure which produces the exposure light IL of a waveband sensitizing a resist layer on the wafer 9. As the exposure light IL, use can be made of the bright line (i-line, j-line or the like) of an a mercury lamp, the laser light of ArF or KrF excimer laser or the like, or the harmonic wave of a metal-vapor laser or a YAG laser. The exposure light IL is reflected by an elliptical mirror 16 and is once converged, whereafter it is reflected by a mirror 19 and is directed to an input lens 20. A shutter 17 is disposed between the elliptical mirror 16 and the mirror 19 (near the second focus of the elliptical mirror 16), and this shutter 17 is rotated by a drive motor 18 to thereby intercept the exposure light IL as required.

Figure 2:
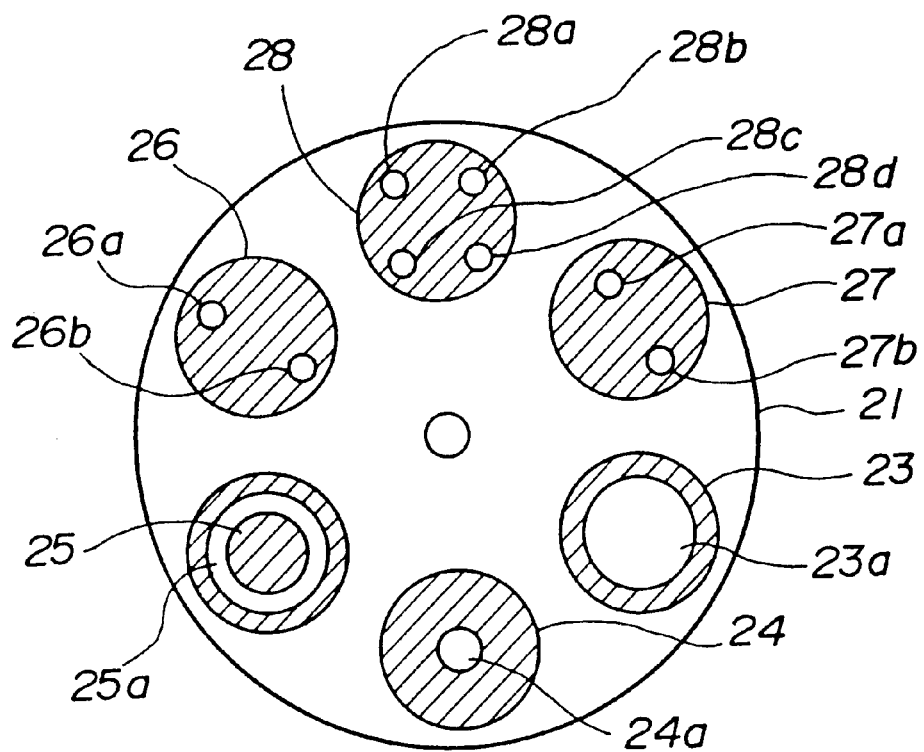
FIG. 2 is a plan view showing a rotatable plate 21 in FIG. 1.

The exposure light IL converted into a substantially parallel light beam by the input lens 20 enters a fly-eye lens 1 as an optical integrator. The substantially uniform secondary light source image of the exposure light IL is formed on the rear (reticle) side focal plane of this fly-eye lens 1. A rotatable plate 21 is rotatably mounted at the location whereat this secondary light source image is formed (i.e., in the Fourier transform surface or the conjugate surface of the reticle pattern in the illuminating optical system or a plane near the same) and the rotatable plate 21 is positioned at a predetermined rotated position by a drive motor (selector) 22. In the rotatable plate 21, as shown in FIG. 2, there are formed e.g. six kinds of aperture stops 23–28 at equiangular intervals. Of these aperture stops, the circular aperture stops 23 and 24 have ordinary circular opening portions 23a and 24a of different diameters, respectively, and the zonal aperture stop 25 has a zonal opening portion 25a. Also, the aperture stops 26 and 27 for oblique illumination have a pair of minute opening portions 26a, 26b and a pair of minute opening portions 27a, 27b, respectively, disposed in directions orthogonal to each other, and the aperture stop 28 for oblique illumination has four minute opening portions 28a–28d disposed equidistantly about the optical axis.

When for example, the aperture stops 26, 27 and 28 are used, it is desirable to set the σ value of the illuminating light beam from each opening portion so as to be of the order of 0.1–0.3. It is also desirable that the design be such that the position of each opening portion in each of the aperture stops 26–28 can be finely adjusted in conformity with the degree of minuteness (the pitch or the like) of the reticle pattern. Also, when the aperture stops 24–28 are used, the uniformity of illuminance on the reticle or the wafer may become bad and therefore, it is desirable to make each element of the fly-eye lens 1 fine (make the cross-sectional area thereof small). Further, another integrator (of the fly-eye type or the rod type) may be added to provide a two-stage integrator structure. Also, during the use of the aperture stops 26–28, the loss of the quantity of light is great and therefore, the design may preferably be such that the exposure light is directed to each opening portion on each aperture stop by the use of a light divider such as an optical fiber or a polygonal prism.

As an example, a circular opening portion 23a in the rotatable plate 21 is disposed on the secondary light source forming surface by the fly-eye lens 1 of FIG. 1. The opening portion 23a is substantially conjugate with the pupil plane (Fourier transform surface) P1 of the projection lens 8. The exposure light IL emerging from the opening portion 23a is converted into a substantially parallel light beam by an output lens 3 and enters a reticle blind 4 as a variable field stop. The opening portion of the reticle blind 4 can be set to any shape and size by driving means 29. The opening portion of the reticle blind 4 is substantially conjugate with the pattern area PA of the reticle 7 and the exposure light IL emerging from the reticle blind 4 is once converged by a relay lens 5. The converging plane P2 of this relay lens is substantially conjugate with the aperture stop surface of the rotatable plate 21, i.e., the exit surface of the fly-eye lens 1 (the reticle side focal plane), and a variable aperture stop 30 for the exposure light IL is disposed on the plane P2 and the diameter of the circular opening portion of the variable aperture stop 30 is set to any value by driving means 31.

The variable aperture stop 30 may be disposed near the exit surface of the fly-eye lens 1 and closely adjacent to the rotatable plate 21.

The principal ray of the exposure light IL emerging from the variable aperture stop 30 is converted into a substantially parallel light beam by a main condenser lens 6, and this substantially parallel exposure light IL is reflected by a mirror 32 to the reticle 7. The pattern of an area selected from the pattern area PA of the reticle 7 by the reticle blind 4 is exposed onto a series of shot areas on the wafer 9 by the projection lens 8. Also, the diameter of the circular opening portion of the variable aperture stop 10 disposed near the pupil plane P1 of the projection lens 8 can be set to any value by driving means 33.

The reference numeral 34 designates an exposure controller, and the reference numeral 35 denotes a main controller for controlling the operation of the entire apparatus. The exposure controller 34 controls the operations of the motor 22, the driving means 29, the driving means 31 and the driving means 33 by instructions from the main controller 35.

That is, the exposure controller 34 can effect the adjustment of the opening portion of the variable aperture stop 10 through the driving means 33 to thereby set the numerical aperture NA of the projection lens 8 to a desired value. Also, the exposure controller 34 can either effect the positioning of the rotatable plate 21 through the motor 22 or effect the adjustment of the opening portion of the variable aperture stop 30 through the driving means 31 to thereby set the numerical aperture of the illuminating system for the exposure light IL and further the σ value which is a coherence factor to desired values.

Specifically, where the reticle 7 is an ordinary reticle, the σ value is set to e.g. 0.5–0.6, and where the reticle 7 is a phase shift reticle, the σ value is set to e.g. 0.1–0.4. Further, the exposure controller 34 can control the shape and size of the opening portion of the reticle blind 4 through the driving means 29 to thereby apply the exposure light IL only to a desired poriton of the pattern area PA of the reticle 7.

The reference numeral 36 designates an exposure data file in which the shape of the pattern area and the data of optimum imaging parameters, etc. are stored correspondingly to the appellations of various reticles. The optimum imaging parameters include the optimum numerical aperture NA of a phototaking lens and the optimum a value of the illuminating system and in addition, for example, an illuminating condition for the reticle (which aperture stop of the rotatable plate 21 should be used). Further, where a plurality of patterns differing in optimum imaging parameters are formed on the pattern area PA of the reticle, the shapes and sizes of those areas and the data of the optimum imaging parameters of each area are stored in the exposure data file 36. The exposure data file 36 is connected to the main controller 35 through a bus line, and the bar code reader 12 is also connected to the main controller 35 through a bus line. The main controller 35 can recognize the optimum imaging parameters or the like of the reticle 7 to be exposed from the exposure data file 36 by the use of the bar code of the reticle 7 sent from the bar coder reader 12, and supplies the information of these optimum imaging parameters or the like to the exposure controller 34.

A description will now be given of the various exposing operations of the projection exposure apparatus of FIG. 1.

[First Example of the Exposing Operation]

This example deals with a case where there are two pattern areas for semiconductor chips comprising a first area and a second area on the reticle 7 and the optimum numerical aperture NA and the σ value differ. The operation in this case will hereinafter be described with reference to FIG. 3. First, at the step 107 of FIG. 3, the reticle 7 is set on the reticle holder 11 of FIG. 1. At this time, the main controller 35 reads the bar code BC of the reticle 7 through the bar code reader 12 and discriminates the appellation of the reticle 7. The main controller 35 refers to the memory area of the exposure data file 36 which corresponds to the discriminated appellation, thereby recognizing the optimum imaging parameters of the two areas of the reticle 7 and the shapes and sizes of the two areas.

Thereafter, at a step 108, the main controller 35 supplies the exposure controller 34 with the optimum imaging parameters of a first area of the reticle 7 to be exposed and the information of the shape and size of the first area. Correspondingly thereto, the exposure controller 34 first selects and sets an aperture stop in the rotatable plate 21 which matches the reticle 7 through the motor 22 to set an illuminating condition for the reticle 7. As an example of this selection standard, the aperture stops 26, 27 and 28 (the proper use of these three can be selected in conformity with the periodicity of the reticle patterns) are used particularly for a minute pattern, and when the line width is not severe, the aperture stop 23 is used, and the aperture stop 24 (or the aperture stop 30) is used for a phase shift reticle. The aperture stop 26 is effective, for example, for periodic patterns arranged in X direction, the aperture stop 27 is effective for periodic patterns arranged in Y direction, and the aperture stop 28 is effective for a two-dimensional pattern. Also, the numerical aperture NA and the σ value may only be changed without the aperture stops 23–28 being changed over for the first area and the second area. Further, independently of the line width, the aperture stops 26 and 27 may be changed over if in the first area and the second area, the periodicities of the patterns thereof are orthogonal to each other. Thereafter, the exposure controller 34 controls the variable aperture stop 10 of the projection lens 8 through the driving means 33 to thereby set the numerical aperture NA of the projection lens 8 to an optimum value. The exposure controller 34 then controls the variable aperture stop 30 through the driving means 31 to thereby set the σ value of the illuminating system to an optimum value. Subsequently, at a step 109, the exposure controller 34 adjusts the shape of the opening portion of the reticle blind 4 to the shape of the first area through the driving means 29 to thereby effect the setting of the reticle blind 4.

The main controller 35 then drives the wafer stage 14 to align a designated shot area which is the current exposure area of the wafer 9 onto the optical axis (step 110), and exposes the pattern of the first area of the reticle 7 to the designated shot area of the wafer 9 (step 111). Subsequently, at a step 112, the main controller 35 examines the pre-stored exposure sequence to thereby discriminate whether the reticle 7 should be exchanged. In the present example, the pattern of the second area of the reticle 7 is exposed without the reticle 7 being exchanged and therefore, the operation shifts to a step 113, where the main controller 35 supplies the exposure controller 34 with the optimum imaging parameters of the second area of the reticle 7 to be exposed and the information of the shape of the second area. Correspondingly thereto, the exposure controller 34 sets a predetermined aperture stop in the rotatable plate 21 through the motor 22, and thereafter sets the numerical aperture NA of the projection lens 8 to an optimum value through the driving means 33. The exposure controller 34 then sets the σ value of the illuminating system to an optimum value through the driving means 31.

Subsequently, at a step 114, the exposure controller 34 adjusts the shape and size of the opening portion of the reticle blind 4 to the shape and size of the second area of the reticle 7 through the driving means 29 to thereby effect the setting of the reticle blind 4. In this case, the designated shot area of the wafer 9 is the same as the last one and therefore, the alignment of the wafer 9 need not be done. So, at a step 115, the main controller 35 exposes the pattern of the second area of the reticle 7 to the same designated shot area of the wafer as the last one through the projection lens 8. Thereafter, at a step 116, whether the exposure to all shot areas of the wafer 9 has been terminated is judged, and if it has not been terminated, the operation shifts to the step 112. If the exposure has been terminated, the operation shifts to a step 117.

If at the step 117, the exposure step has been terminated, the exposing operation is terminated, but when the reticle is to be exposed onto the next wafer, the operation shifts to the step 107 and exposure is likewise effected.

In this manner, even when a plurality of areas differing in optimum imaging parameters exist on the reticle 7, exposure can be effected with respect to the respective areas under optimum imaging conditions. In the first example of the exposing operation, the patterns of the first area and the second area on the first reticle area are exposed onto each shot area of the wafer (at this time, alignment need be effected for each shot when the pattern of the second area is exposed), but after the pattern of the first area of the first reticle is exposed onto all of the plurality of the shot areas on the wafer to which the pattern of the first area is to be exposed, the reticle blind 4 may be driven so that the pattern of the second area may be exposed onto all shot areas to which the pattern of the first area has been previously exposed. Thereafter, with regard to shot areas on the same wafer onto which exposure is not yet effected, exposure can be effected by an operation similar to what has been described above, by the use of a second reticle, a third reticle, and so on.

[Second Example of the Exposing Operation]

This example deals with a case where with a view to disperse the risk during the production of an IC for specific use (ASIC), screen synthesis or small lot production, plural kinds of semiconductive chips are formed on a wafer by the use of a plurality of reticles and optimum imaging parameters differ.

The operation in this case will also be described with reference to FIG. 3. A plurality of reticles used are defined as a first reticle, a second reticle and so on. First, at the step 107 of FIG. 3, the first reticle is set on the reticle holder 11. At this time, the main controller 35 reads the bar code BC of the first reticle through the bar code reader 12 and discriminates the appellation of that reticle. The main controller 35 then refers to a memory area in the exposure data file 36 which corresponds to the discriminated appellation, thereby recognizing the optimum imaging parameters of each of the pattern areas of the first reticle and the shapes and sizes of the pattern areas.

Thereafter, at the step 108, the main controller 35 supplies the exposure controller 34 with the optimum imaging parameters of the first reticle 7 to be exposed and the information of the shapes and sizes of the pattern areas. Correspondingly thereto, the exposure controller 34 first selects and sets the aperture stops 23–28 in the rotatable plate 21 which match the reticle 7 to set an illuminating condition for the reticle 7. Thereafter, the exposure controller 34 sets the numerical aperture NA of projection lens 8 to an optimum value and also sets the σ value of the illuminating system to an optimum value. At the next step 109, the exposure controller 34 adjusts the shape of the opening portion of the reticle blind 4 to the shape of the pattern area of the first reticle to thereby effect the setting of the reticle blind 4.

The main controller 35 drives the wafer stage 14 to set a designated shot area which is the current exposure area of the wafer 9 on the optical axis of the projection lens 8 (step 110), and exposes the pattern of the pattern area of the first reticle to the designated shot area of the wafer 9 through the projection lens 8 (step 111). Subsequently, at the step 112, the main controller 35 examines the pre-stored exposure sequence to thereby discriminate whether the first reticle should be exchanged. In the present example, the reticle is exchanged and therefore, the operation shifts to the step 118, where the main controller 35 sets the second reticle on the reticle holder 11. At this time, the main controller 35 examines the appellation of the second reticle through the bar code reader 12 and refers to the exposure data file 36 to thereby recognize an illuminating condition for the second reticle (the setting of the optimum aperture stops 23–28), the values of optimum imaging parameters and the shape of the pattern area.

Thereafter, at a step 119, the main controller 35 supplies the exposure controller 34 with the optimum imaging parameters of the pattern area of the second reticle to be exposed and the information of the coordinates of the outline of that pattern area. Correspondingly thereto, the exposure controller 34 first sets one of the aperture stops 23–28 in the rotatable plate 21 which is fit for the second reticle through the motor 22. Thereafter, the exposure controller 34 sets the numerical aperture NA of the projection lens 8 to an optimum value through the driving means 33 and also sets the σ value of the illuminating system to an optimum value.

Subsequently, at a step 120, the exposure controller 34 adjusts the shape of the opening portion of the reticle blind 4 to the shape of the pattern area of the second reticle through the driving means 29 to thereby effect the setting of the reticle blind 4. Thereafter, at a step 121, the main controller 35 aligns the designated shot area on the wafer 9 for exposing the second reticle onto the optical axis of the projection lens 8. The main controller 35 then exposes the pattern of the pattern area of the second reticle onto the designated shot area on the wafer 9 for the second reticle through the projection lens 8. Thereafter, at a step 122, whether exposure to all shot areas of the wafer 9 has been terminated is discriminated, and if it has not been terminated, the operation shifts to the step 112. If said exposure has been terminated, the operation shifts to the step 117.

By such an operation, the patterns of a plurality of reticles differing in optimum imaging parameters can be exposed onto a wafer under optimum imaging conditions.

[Third Example of the Exposing Operation]

This example deals with a case where patterns of plural kinds of line widths differing in optimum imaging parameters mixedly exist in a semiconductor chip, i.e., in a reticle pattern for exposure, and it is difficult to divide the exposure field of the reticle 7 by the reticle blind 4 as in the first example of the exposing operation.

Figure 4A:
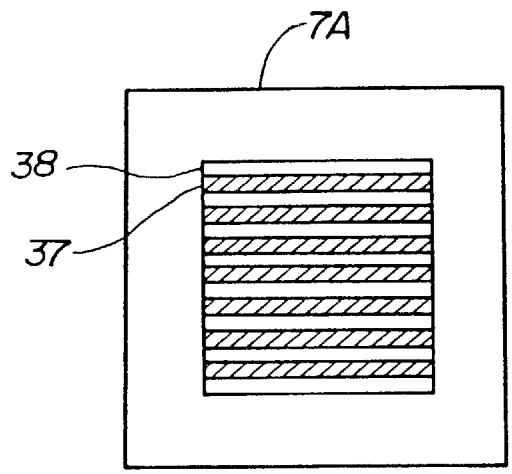
FIGS. 4A and 4B are plan views showing modifications of the pattern of a reticle used in the embodiment.
Figure 4B:
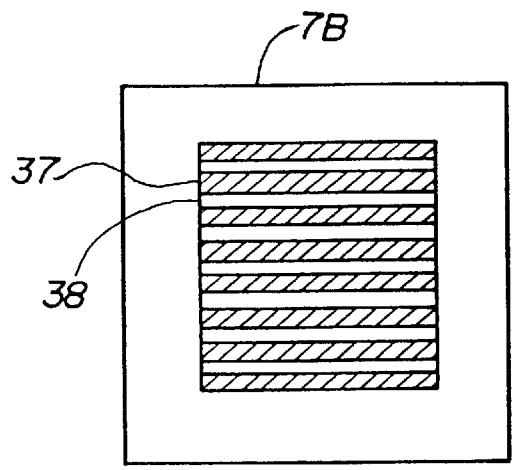

In this case, the pattern of the original reticle is divided into a plurality. The plurality of divided patterns are then formed on discrete reticles or on different areas in one and the same reticle. Where those patterns are formed on discrete reticles, there are prepared a plurality of reticles 7A and 7B on which patterns differing in the values of optimum imaging parameters are formed as shown in FIGS. 4A and 4B. In FIGS. 4A and 4B, areas 37 indicated by hatching are light intercepting areas provided by deposited chromium film, and white areas 38 are areas in which necessary patterns are depicted. Accordingly, in the reticle 7A and the reticle 7B, the light intercepting areas 37 are 180° out of phase with each other.

These two reticles 7A and 7B are exposed on a wafer in a sequence similar to that in the second example of the exposing operation. The difference of the present example from the second example of the exposing operation is that the patterns of two different reticles are exposed onto the same area on the wafer.

[Fourth Example of the Exposing Operation]

This example deals with a case which is the same as the above-described third example of the exposing operation, but where the plural kinds of line widths on a reticle are so intricate that it is difficult to cope with by a plurality of reticles as shown in FIG. 4.

In this case, when at the step 111 of FIG. 3, the reticle is exposed to each shot area of a wafer, the numerical aperture NA of the projection lens 8 and the σ value of the illuminating system are continuously varied over a predetermined range, whereby not the best but the second best imaging characteristic can be obtained. The above-mentioned predetermined range is, for example, between the imaging parameter of the pattern of the greatest line width and the imaging parameter of the smallest line width on the reticle.

[Fifth Example of the Exposing Operation]

This example deals with a case where so-called test print for finding optimum conditions for exposure is effected. The test print has heretofore meant that when the pattern of a reticle is to be exposed onto a series of shot areas of a wafer by step and repeat, the focus position Z which is the position of the wafer 9 in the direction of the optical axis of the projection lens 8 and exposure time T are varied little by little during the exposure of each shot to thereby effect exposure.

Figure 5A:
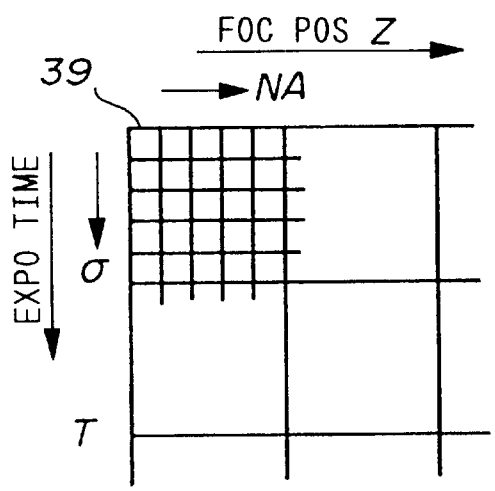
FIGS. 5A and 5B are maps showing examples of the map of the test print in the embodiment.
Figure 6:
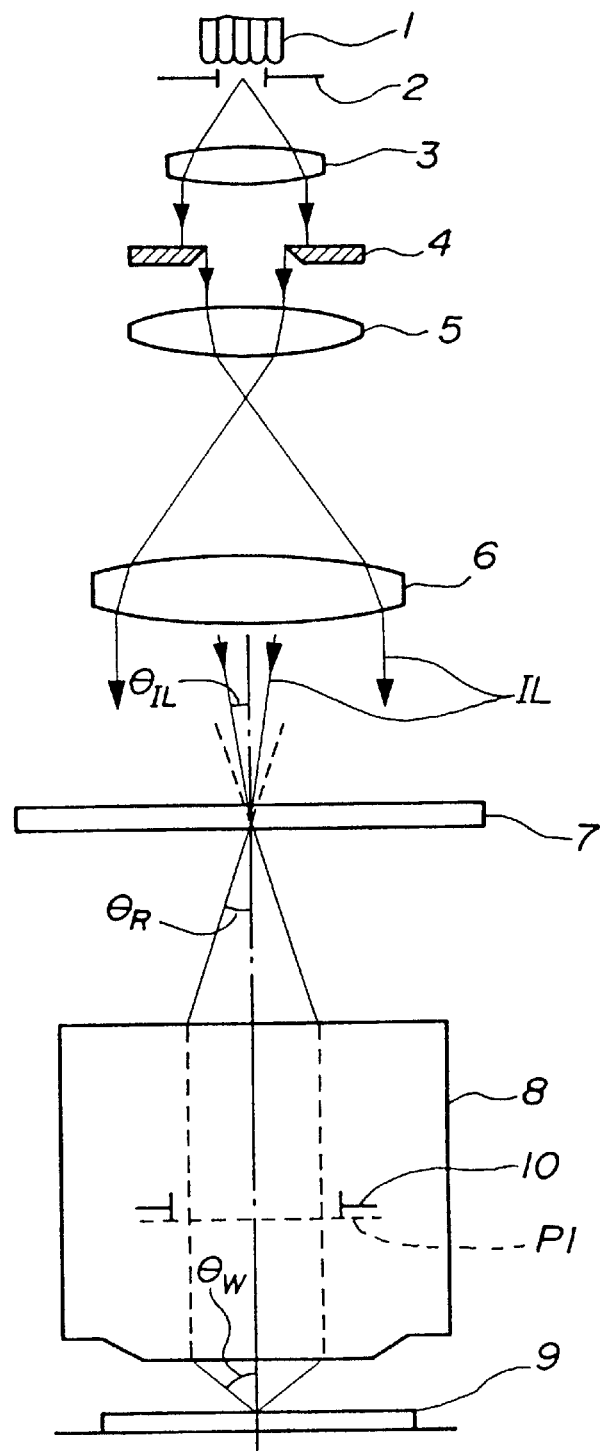
FIG. 6 is a schematic view showing the illuminating system of a projection exposure apparatus according to the prior art in a simplified manner.
Figure 7:
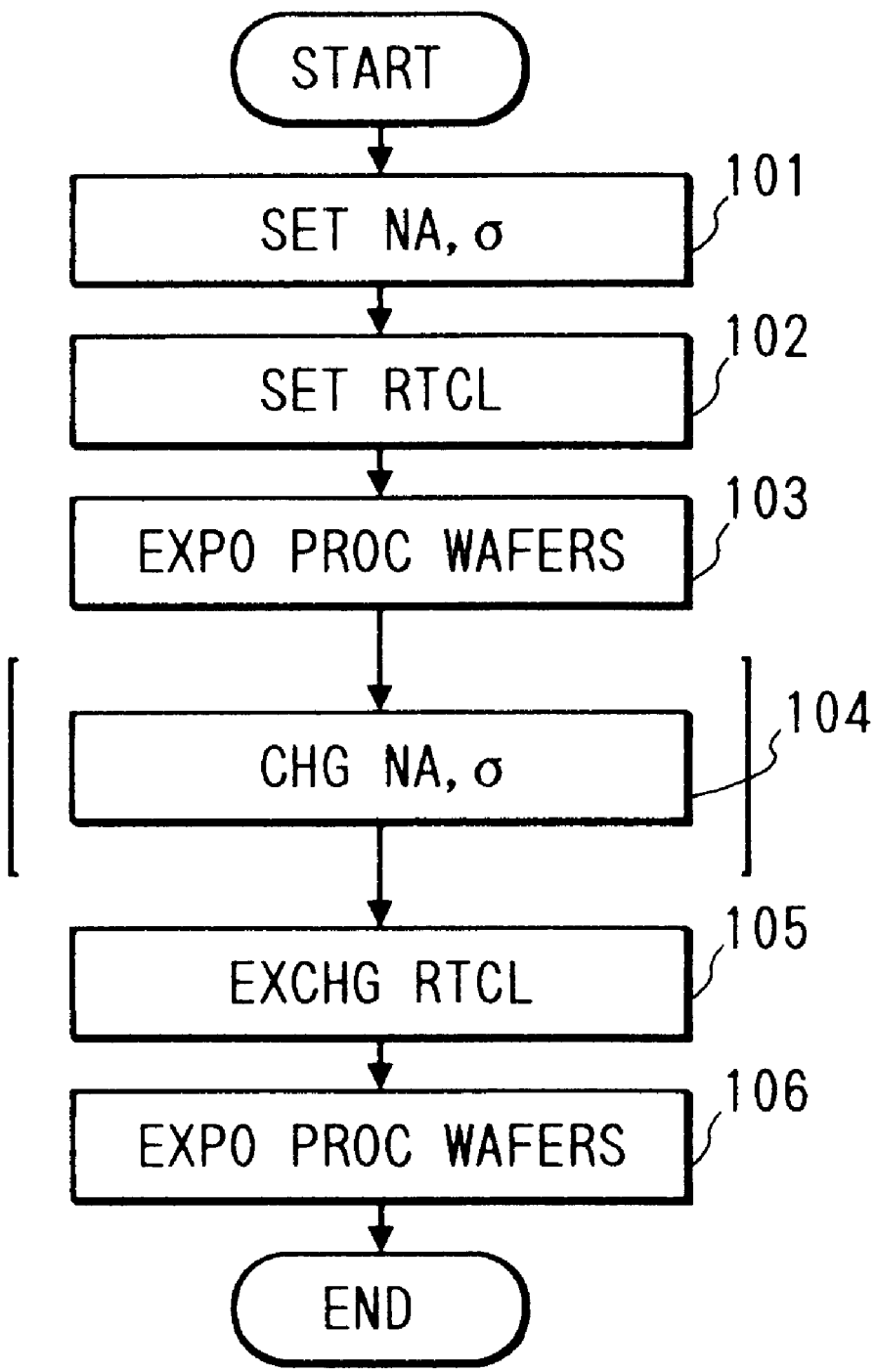
FIG. 7 is a flow chart showing the exposing operation of the projection exposure apparatus according to the prior art.

In contrast, in this example, imaging conditions are variously varied as shown, for example, in the map of FIG. 5A, in accordance with a sequence similar to that in the first example of the exposing operation, to thereby effect exposure. In the present example, however, it is not necessary to vary the reticle blind 4 corresponding to the shape of the opening portion of the reticle blind 4. In FIG. 5A, the reference numeral 39 designates a designated shot area on a wafer, and a number of shot areas similar to the designated shot area 39 are disposed lengthwisely and widthwisely, and a resolving power test pattern is exposed onto each shot area. As regards the imaging conditions, the focus position Z of the wafer varies for each five shot areas relative to the lateral direction in FIG. 5A and the numerical aperture NA of the projection lens varies at a period of five in each one shot area. Also, the exposure time T varies for each five shot areas relative to the lengthwise direction in FIG. 5A, and the σ value of the illuminating system varies at a period of five in each one shot area.

Figure 5B:
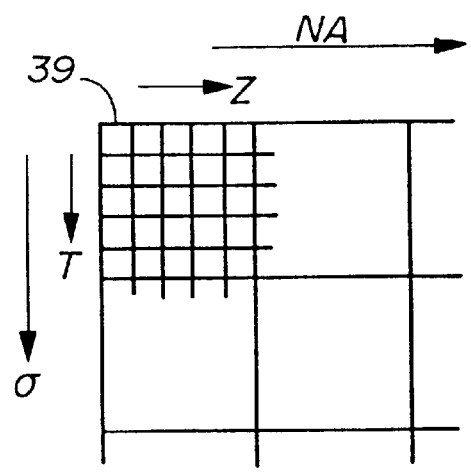

Besides, the imaging conditions may be changed as shown in the map of FIG. 5B. As regards the imaging conditions, the numerical aperture NA of the projection lens varies for each five shot areas relative to the lateral direction in FIG. 5B and the focus position Z of the wafer varies at a period of five in each one shot area. Also, the σ value of the illuminating system varies for each five shot areas relative to the lengthwise direction in FIG. 5B, and the exposure time T varies at a period of five in each one shot area.

By carrying out a test print by the maps as shown in FIG. 5, the test print at four parameters comprising the numerical aperture NA, the σ value, the focus position Z and the exposure time T can be accomplished.

The present invention is not restricted to the above-described embodiment, but of course can assume various constructions without departing from the gist of the invention.

What is claimed is:

1. A projection exposure apparatus comprising:

an illumination system which illuminates a pattern on a mask with exposure light;

a projection optical system which projects an image of said pattern illuminated by said illumination system, to a photosensitive substrate;

a plurality of oblique illumination stops provided in said illumination system on a surface that is substantially optically conjugate with respect to a secondary image of a light source of said exposure light;

a selector which selects one of said plurality of oblique illumination stops;

a variable aperture stop provided substantially on a pupil plane of said projection optical system;

an aperture stop driver which varies a diameter of a circular aperture of said variable aperture stop; and an exposure controller which controls said selector and said aperture stop driver, in accordance with said pattern on said mask.

2. A projection exposure apparatus according to claim 1, wherein maid plurality of oblique illumination stops include annular aperture stops.

3. A projection exposure apparatus according to claim 1, further comprising;

a blind provided on a surface that is substantially optically conjugate with said pattern with respect to said illumination system, which blocks a part of said exposure light; and a blind driver which varies a shape and a size of said blind.

4. A projection exposure apparatus according to claim 1, wherein a content of said pattern is recorded on said mask, and maid projection exposure apparatus further comprises a reader which reads the content of said pattern.

5. A projection exposure apparatus according to claim 1, wherein said mask is provided with a first pattern and a second pattern of which a line width is different from that of the first pattern.

6. A projection exposure apparatus comprising:

an illumination system having a light source, which illuminates a pattern on a mask with exposure light;

a projection optical system disposed between said mask and a photosensitive substrate, which projects an image of said pattern illuminated by said illumination system to said photosensitive substrate;

a plurality of aperture stops on a rotatable plate provided between said light source and said mask;

a selector connected to said plurality of aperture stops, which selects one of said plurality of aperture stops;

a variable aperture stop provided substantially on a pupil plane of said projection optical system;

a variable aperture driver connected to said variable aperture stop, which varies an aperture configuration of said variable aperture stop; and an exposure controller connected to said selector and said variable aperture driver, which controls said selector and said variable aperture driver, in accordance with said pattern on said mask.

* * * * *